(12) United States Patent
Keidar Barner et al.

(10) Patent No.: US 8,352,234 B2
(45) Date of Patent: Jan. 8, 2013

(54) MODEL GENERATION BASED ON A CONSTRAINT AND AN INITIAL MODEL

(75) Inventors: Sharon Keidar Barner, Haifa (IL); Shiri Moran, Haifa (IL); Ziv Nevo, Haifa (IL); Sitvanit Ruah, Haifa (IL); Tatyana Veksler, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 633 days.

(21) Appl. No.: 12/564,931

(22) Filed: Sep. 23, 2009

(65) Prior Publication Data

US 2011/0071809 A1 Mar. 24, 2011

(51) Int. Cl.
*G06F 17/50* (2006.01)
(52) U.S. Cl. .......................................... 703/15; 716/106
(58) Field of Classification Search .................... 703/14, 703/13, 2, 15; 714/37; 716/106; 717/124
See application file for complete search history.

(56) References Cited

U.S. PATENT DOCUMENTS

| 6,311,293 | B1 * | 10/2001 | Kurshan et al. | 714/37 |
| 7,159,198 | B1 * | 1/2007 | Ip et al. | 716/106 |
| 7,478,028 | B2 * | 1/2009 | Ho et al. | 703/14 |
| 7,895,552 | B1 * | 2/2011 | Singhal et al. | 716/106 |
| 8,166,430 | B2 * | 4/2012 | Bormann et al. | 716/106 |
| 2002/0124208 | A1 * | 9/2002 | Beer et al. | 714/37 |
| 2002/0144236 | A1 * | 10/2002 | Beer et al. | 717/124 |
| 2003/0225552 | A1 * | 12/2003 | Ganai et al. | 703/2 |
| 2004/0064794 | A1 * | 4/2004 | Yang | 716/2 |
| 2007/0050181 | A1 * | 3/2007 | Yang | 703/22 |
| 2009/0319252 | A1 * | 12/2009 | De et al. | 703/14 |

OTHER PUBLICATIONS

Ammann et al., "Abstracting formal specification to generate software tests via model checking", IEEE 1999.*
Jason Baumgartner et al., "Optimal Constraint-Preserving Netlist Simplification", FMCAD '08: Proceedings of the 2008 International Conference on Formal Methods in Computer-Aided Design, pp. 1-9, Piscataway, NJ, USA, 2008. IEEE Press.
Ed Cerny et al., "Supporting sequential assumptions in hybrid verification." in ASP-DAC '05: Proceedings of the 2005 conference on Asia South Pacific design automation, pp. 1035-1038, New York, NY, USA, 2005. ACM.
T. Henzinger, S. Qadeer, and S. Rajamani. Decomposing refinement proofs using assumeguarantee reasoning. In IEEE/ACM International Conference on Computer Aided Design (ICCAD-2000), pp. 245-252, 2000.
O. Kupferman and M. Y. Vardi. An automata-theoretic approach to modular model checking. ACM Trans. Program. Lang. Syst., 22(1):87-128, 2000.
H. Mony, J. Baumgartner, and A. Aziz. Exploiting constraints in transformation-based verification. In CHARME, pp. 269-284, 2005.

(Continued)

*Primary Examiner* — Kandasamy Thangavelu
(74) *Attorney, Agent, or Firm* — Ziv Glazberg

(57) ABSTRACT

A computerized system comprising: a processor; a first interface configured to obtain a constraint; a second interface configured to obtain a first model, wherein the first model is configured to be utilized in model checking, and the first model, when constrained by the constraint, comprises at least one finite path; and a finite path removal module implemented in the processor and configured to generate a second model equivalent to the first model obtained by said second interface, wherein the second model excludes a portion of the at least one finite path, and the second model is configured to be utilized in model checking.

24 Claims, 4 Drawing Sheets

OTHER PUBLICATIONS

N. Piterman, A. Pnueli, and Y. Sa'ar. Synthesis of reactive(1) designs. In 7th International Conference on Verification, Model Checking, and Abstract Interpretation, pp. 364-380. Springer Berlin / Heidelberg, 2006.

B. Yang, R. G. Simmons, R. E. Bryant, and D. R. O'Hallaron. Optimizing symbolic model checking for constraint-rich models. In Computer Aided Verification, pp. 328-340, 1999.

J. Yuan, K. Albin, A. Aziz, and C. Pixley. Constraint synthesis for environment modeling in functional verification. In DAC, pp. 296-299. ACM, 2003.

Wikipedia, "Existential quantification", last modified on Jul. 1, 2012 at 19:34. URL: http://en.wikipedia.org/wiki/Existential_quantification.

Geist et al., "Supporting SAT based BMC on Finite Path Models", Electronic Notes in Theoretical Computer Science (ENTCS) archive, vol. 144 Issue 1, pp. 67-77, Jan. 2006.

* cited by examiner

MODEL GENERATION BASED ON A CONSTRAINT AND AN INITIAL MODEL

BACKGROUND

The present disclosure relates to model checking in general, and to generation of a model to be utilized in model checking in particular.

Computerized devices control almost every aspect of our life—from writing documents to controlling traffic lights. However, computerized devices are bug-prone, and thus require a testing phase in which the bugs should be discovered. The testing phase is considered one of the most difficult tasks in developing a computerized device. Many developers of computerized devices devote a significant portion, such as 70%, of the development cycle to discover erroneous behaviors of the computerized device, also referred to as a target computerized system. The target computerized system may comprise hardware, software, firmware, a combination thereof and the like.

One known quality assurance technique is formal verification using a model checker. A model, which corresponds to the target computerized system, also referred to as a design, defines a set of variables and their respective behavior based upon each other and inputs from an environment. The model may be described by a state-machine. In some cases, a constraint, also referred to as an assumption, may be defined to limit the model. The constraint may define a property that must be held by every legal behavior of the design and the environment. A behavior of the design and the environment may be described by a set of consecutive states and a legal behavior may be a behavior that is associated with a set of consecutive states, where each state holds the constraint. The constraint may be utilized to specify the environment in which the design operates in. For example, the environment may provide an input in each cycle that is different than the previous cycle. Additionally, the constraint may be utilized to limit a portion of the design itself, such as for example determining that a specific state or set of states may never be reached by the design. Using constraints for specifying the environment or model may be more convenient or readable. Moreover, it may be less error-prone than describing a full state-machine of the environment or model manually.

As is known in the art, for example in GEIST et al., Supporting SAT based BMC on Finite Path Models, Electronic Notes in Theoretical Computer Science 144 (2006) 67-77, any path in a model can always be extended to include an additional successive state to the last state of the path. Each such path is referred to as an "infinite path". However, when a constraint is introduced, a finite path may be induced due to the constraint. In the present disclosure, a "finite path with respect to a constraint" is an infinite path in the model that is induced by the constraint to be finite path. Such infinite path comprises a state that all its possible successive states according to the model are in violation of the constraint and therefore is induced to be a dead-end state. The finite path always comprises a dead-end state as its terminal state of the path.

BRIEF SUMMARY OF THE INVENTION

One exemplary embodiment of the disclosed subject matter is a computerized system comprising: a processor; a first interface configured to obtain a constraint; a second interface configured to obtain a first model, the first model is configured to be utilized in model checking, the first model comprising an at least one finite path with respect to the constraint obtained by the first interface; and a finite path removal module configured to generate a second model substantially equivalent to the first model obtained by the second interface, the second model excludes a portion of the at least one finite path, the second model is configured to be utilized in model checking.

Another exemplary embodiment of the disclosed subject matter is a method comprising: obtaining a first constraint; obtaining a model, the model is configured to be utilized in model checking, the model comprising an at least one finite path with respect to the first constraint; and removing a portion of the at least one finite path from the model, the removing the portion of the at least one finite path is performed using a processor; whereby the model is transformed to include a portion of the constraint.

Yet another exemplary embodiment of the disclosed subject matter is a computer program product comprising: a computer readable medium; first program instruction for obtaining a first constraint; second program instruction for obtaining a model, the model is configured to be utilized in model checking, the model comprising an at least one finite path with respect to the first constraint; and third program instruction for removing a portion of the at least one finite path from the model wherein the first, second, and third program instructions are stored on the computer readable medium.

THE BRIEF DESCRIPTION OF THE SEVERAL VIEWS OF THE DRAWINGS

The present disclosed subject matter will be understood and appreciated more fully from the following detailed description taken in conjunction with the drawings in which corresponding or like numerals or characters indicate corresponding or like components. Unless indicated otherwise, the drawings provide exemplary embodiments or aspects of the disclosure and do not limit the scope of the disclosure. In the drawings.

Figure 1:
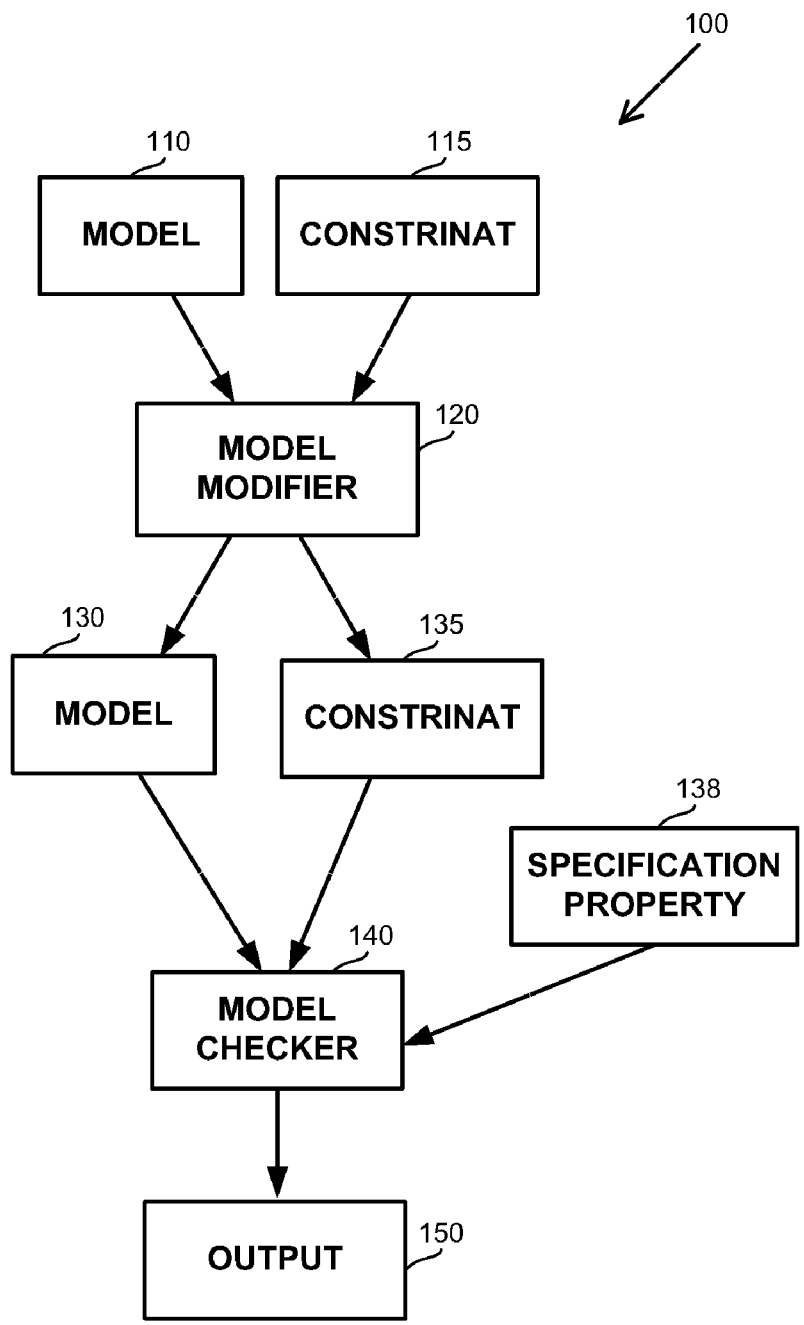
FIG. 1 shows a computerized environment in which the disclosed subject matter is used, in accordance with some exemplary embodiments of the subject matter.

The disclosed subject matter is described below with reference to flowchart illustrations and/or block diagrams of methods, apparatus (systems) and computer program products according to embodiments of the subject matter. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create a device for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

One technical problem dealt with by the disclosed subject matter is to perform model checking on a model associated with a constraint. Another technical problem is to modify a model to include a restriction enforced by the constraint.

One technical solution is to strengthen the constraint with respect to the model. Another technical solution is to remove a finite path from the model with respect to the constraint. Yet another technical solution is to determine a behavior of a variable in the model based on the constraint. Yet another technical solution is to determine a formula of a variable based on the model and substitute the variable in the constraint with the formula. Yet another technical solution is to heuristically select a variable to substitute.

One technical effect of utilizing the disclosed subject matter is transforming the model to a substantially equivalent model having a reduced number of finite paths with respect to the constraint. Another technical effect is enabling a model checker utilizing explicit traversing methods to efficiently traverse the modified model. Yet another technical effect is reducing a measurement of nondeterminism in the model to avoid violating the constraint. Yet another technical effect is expanding the constraint to include nondeterministic variables and limiting the nondeterminism associated with the nondeterministic variables based on the constraint. Yet another technical effect is to be able to ignore a portion of the constraint, or in some cases the entire constraint, without examining behaviors that violate the constraint.

Referring now to FIG. 1 showing a computerized environment in which the disclosed subject matter is used, in accordance with some exemplary embodiments of the subject matter. A computerized environment 100 comprises a model modifier 120. The model modifier 120 is configured to modify a model 110 and a constraint 115 and produce a modified model 130 and a modified constraint 135. In some exemplary embodiments, the modified constraint 135 is a non-limiting constraint, such as a TRUE constraint. The modified model 130 is substantially equivalent to the model 110 when its states are constrained by the constraint 115.

In some exemplary embodiments, the model 110 or the constraint 115 may be an outcome of other processes, such as for example reduction or other model modifiers, similar to the model modifier 120.

In some exemplary embodiments, the constraint 115 induces one or more finite paths in the model 110. The model 110, when constrained by the constraint 115, may comprise one or more infinite paths, i.e., paths that are not pruned by the constraint 115 to include a dead-end state. The modified model 130 may comprise at most a portion of the finite path with respect to the modified constraint 135. The modified model 135 may comprise the one or more infinite paths. The modified model 135 may be equivalent to the mode 110 with respect to infinite paths.

In some exemplary embodiments, the model modifier 120 may determine that the model 110 comprises no infinite paths, when constrained by the constraint 115 and therefore the model 110 may be deemed non-interesting. For example, some specification properties, such as safety properties, may be vacuously held. As another example, some specification properties, such as liveness properties may be violated by definition. The model modifier 120 may provide an output to a user (not shown) to indicate such a scenario, such that the user may examine the constraint 115 or the mode 110 to determine whether there is an error in their respective definitions.

In some exemplary embodiments, the model 110 may be defined using a modeling language such as Verilog, SystemC, VHDL, General Description Language (GDL), SystemVerilog, Property Specification Language (PSL), Unified Modeling Language or the like. The model 110 may describe a behavior of a target computerized device, such as a processor, a chip, a communication device utilizing a protocol or the like. The model 110 may describe all possible behaviors of the target computerized device by describing a transformation from a state to a next state. In some exemplary embodiments, each state may have a next state, describing the state of the target computerized device in a succeeding timeframe.

In some exemplary embodiments, the constraint 115 may be defined using a temporal logic language, such as PSL, Boolean logic predicates and the like. The constraint 115 may define a behavior that is designated not to be model checked. The constraint 115 may define limitations on an input to the model 110, such as limiting the input to having a predetermined behavior such as for example never providing two successive identical values to an input. As another example, the constraint 115 may define that at each cycle, only one input out of a predetermined set of inputs is triggered and may be deemed "hot". The constraint 115 may define states of the model 110 which should not be modeled checked. The constraint 115 may induce a state in the model 110 not to have a next state as the next state may be violating the constraint 115.

In some exemplary embodiments, the computerized environment 100 further comprises a model checker 140 for model checking the modified model 130, when constrained by the modified constraint 135, so that it holds a specification property 138. The specification property 138 may be a safety property, such as for example insuring that a bad state is never reached. The specification property 138 may be a liveness property, such as for example insuring that from any state of the modified model 130 a good state is eventually reached. The model checker 140 may provide a same output 150 for model checking the modified model 130 with respect to the constraint 135 as it provides for model checking the model 110 with respect to the constraint 115.

In some exemplary embodiments, the model checker 140 may disregard finite paths in a model being examined. A state having no next state, also referred to as an end-state, may be considered a state which may not be reached in the target computerized device and therefore the model checker 140 may disregard it. The model checker 140 may further disregard any state on the path leading to the end-state, providing that from that state there is no alternative infinite path. The model checker 140 may disregard a violation of the specification property 138 that occurs in a state that resides only on finite paths. In some exemplary embodiments, the model checker may utilize explicit traversal method to traverse a model. Such traversal methods are inefficient when finite paths are encountered, as a backtracking is forced in an end of a finite path, and a computation performed by traversing the finite path may be scrapped.

Figure 2A:
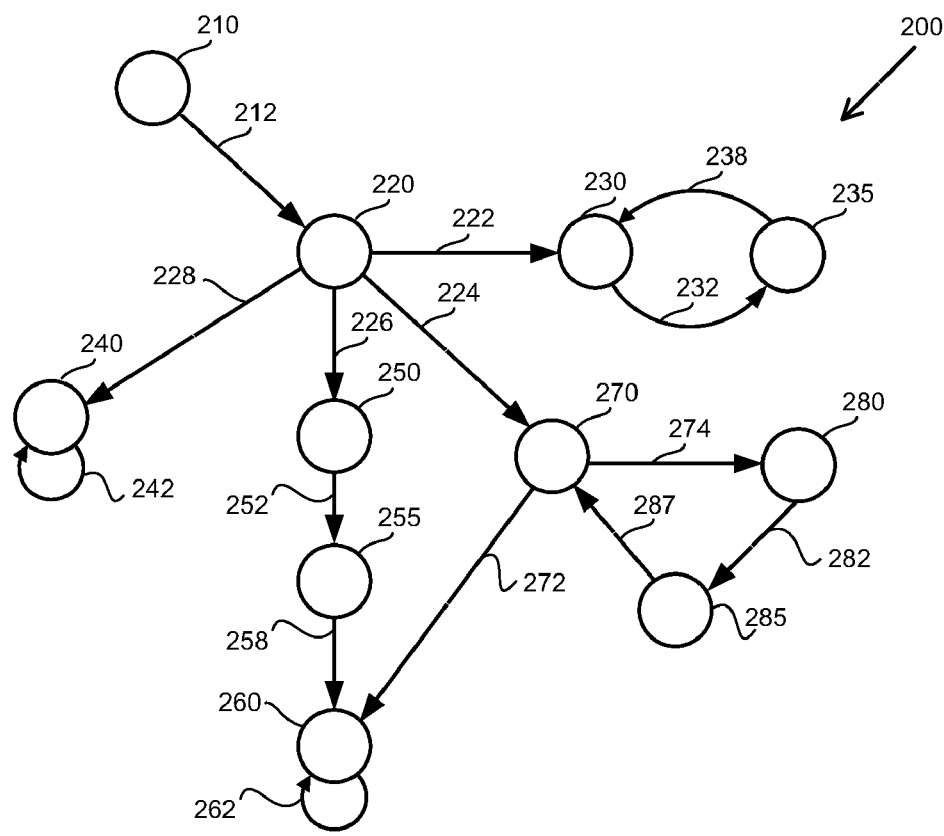
FIG. 2A shows a block diagram of a model, in accordance with some exemplary embodiments of the disclosed subject matter.
Figure 2B:
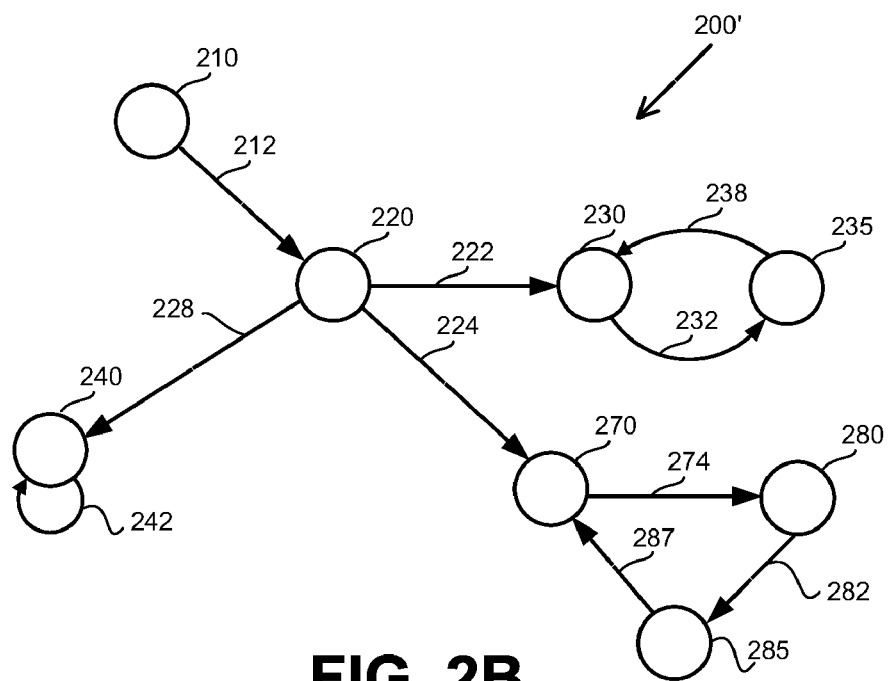
FIG. 2B shows a block diagram of a model, in accordance with some exemplary embodiments of the disclosed subject matter.

FIGS. 2A and 2B show block diagrams of models, in accordance with some exemplary embodiments of the disclosed subject matter. A model 200 comprises a plurality of states 210, 220, 230, 235, 240, 250, 255, 260, 270, 280, 285. The model 200 further comprises a plurality of edges 212, 222, 224, 226, 228, 232, 238, 242, 252, 258, 262, 272, 274, 282, 287. The plurality of edges may represent a transition relation between a state and a next state. An edge, such as edge 212, is a directed edge from a first state, such as the state 210, to a second state, such as the state 220. The edge may be equivalent to defining that in case a state of the model is the first state, a state of the model in the succeeding cycle, timeframe, discrete event or the like is the second state. The disclosed subject matter may modify the model 200 in accordance to a constraint (not shown) and provide a modified model 200'.

Some states in the model 200 may have more than one successive state, such as for example state 220 which has four successive states: the state 230, 240, 250 and 270. Determining which of the possible successive states is traversed to may be determined nondeterministically, such as for example based on an input from an environment of the model.

In some exemplary embodiments, a state, such as the state 220, may comprise state variables defining a state of the target computerized device. For example, a value of a register, a program counter, a flip-flop or the like. An edge, such as the edge 222, may represent a transition based upon current values of the state, such as a next program counter, an output of a computation assigned to a flip-flop or the like. An edge may represent a transition to a state based upon an input to the target computerized device, such as user input, clock input, input from another component in a system or the like.

In some exemplary embodiments, one or more states of the model 200, such as the state 210 may be initial states.

In some exemplary embodiments, a constraint (not shown), such as constraint 115 of FIG. 1, may restrict some states from being model checked. In an exemplary embodiment, state 260 may violate the constraint. The state 260 is a successive state of the states 270, 255. In accordance with the disclosed subject matter, the model 200 may be transformed to the modified model 200' such that it includes a reduced number of finite paths with respect to the constraint. For example, the model 200 comprises a finite path 210, 220, 250 255, 260. The modified model 200' does not comprise the aforementioned finite path. The modified model 200' comprises all infinite paths in the model 200.

In some exemplary embodiments, the constraint may be strengthened such that state 255 may also violate the constraint. The constraint may be strengthened to achieve an early violation of the constraint. The state 255 is on an infinite path ending in state 260. The state 255 has no other next state besides the state 260. Therefore, the state 255 resides on a finite path only and does not reside on an infinite path. The disclosed subject matter may remove state 255 such that the constraint is violated in less cycles than with respect to the original non-strengthened constraint. In some exemplary embodiments, state 270 which is also a predecessor state of the state 260 is not removed from the modified model 200'. The state 270 is not removed as it comprised in an infinite path, such as for example a path which starts with states 210, 220 and enters an infinite loop of states 270, 280 and 285.

In some exemplary embodiments, the constraint may be strengthened such that the predecessor state of state 255, i.e. state 250 may also violate the constraint. In this exemplary embodiment, the modified model 200' may define three possible successive states to state 220—states 230, 240 and 270. The measurement of nondeterminism in the modified model 200' is reduced with respect to the model 200, as instead of four possible next states, there are only three.

In some exemplary embodiments, the constraint may be strengthened to exclude states in finite paths in a first possible state, e.g. in a first state of the finite path which is not comprised by any other infinite paths. In the finite path 210, 220, 250, 255, 260, such first state is the state 250.

In some exemplary embodiments, the modified model 200' may still comprise finite paths. The modified model 200' may comprise a finite path which was shortened or which was not shortened at all. The disclosed subject matter may not remove finite paths due to user preferences, rules, resource limitations such as time or memory, optimizations or the like.

Figure 3:
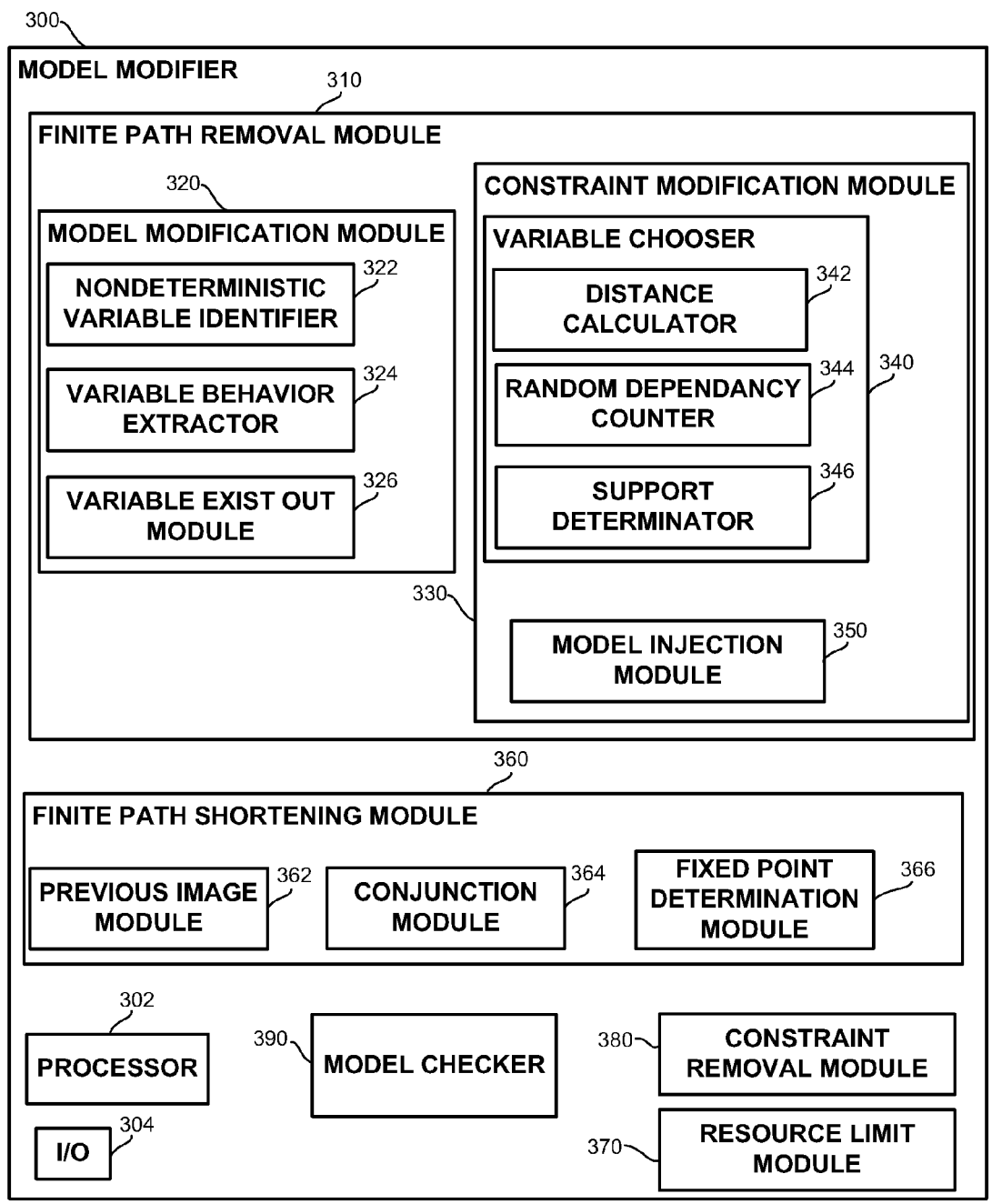
FIG. 3 shows a block diagram of a model modifier, in accordance with some exemplary embodiments of the disclosed subject matter.

Referring now to FIG. 3 showing a block diagram of a model modifier, in accordance with some exemplary embodiments of the disclosed subject matter. A model modifier 300, such as 120 of FIG. 1, may be configured to modify a model with respect to a constraint. The model modifier 300 may further modify the constraint such as to reduce it to not include limitations which are enforced by the modified model.

In some exemplary embodiments, the model modifier 300 comprises a processor 302. The processor 302 may be a Central Processing Unit (CPU), a microprocessor, an electronic circuit, an Integrated Circuit (IC) or the like. The processor 302 may be utilized to perform computations required by the model modifier 300 or any of it subcomponents.

In some exemplary embodiments, the model modifier 300 may comprise an I/O module 304. The I/O module 304 may be utilized as an interface for obtaining a model. The I/O module 304 may be utilized as an interface for obtaining a constraint. The I/O module 304 may be utilized to provide an output of a modified constraint or a modified model generated by the model modifier 300. The I/O module 304 may obtain information from a user using an input device such as a keyboard. The I/O module 304 may obtain information from another computerized device using a communication protocol. In some exemplary embodiments, the I/O module 304 may obtain information from a storage device, user, another computerized device or the like.

In some exemplary embodiments, the model modifier 300 may comprise a finite path shortening module 360. The finite path shortening module 360 may strengthen a constraint to include additional limitations such that a finite path may encounter a state violating the constraint in an earlier state than before. Such as for example by adding a limitation that renders state 250 of FIG. 2A in violation of the constraint.

In some exemplary embodiments, the finite path shortening module 360 comprises a previous image module 362. The previous image module 362 may compute a set of states which are predecessor states of states that violate a constraint. In some exemplary embodiments, the previous image module 362 may compute a set of states which are predecessor states only to states that violate a constraint. For example, in case the state 260 of FIG. 2A violates the constraint, the previous image module 362 may include the state 255 of FIG. 2A and exclude the state 270 of FIG. 2A. The previous image module 362 may compute a previous image of a set of one or more states that violate the constraint, such as for example prev_image(C), where C represents the constraint.

In some exemplary embodiments, the previous image module 362 may compute a set of states which are predecessor states of states that hold the constraint. The previous image module 362 may compute a previous image of a set of one or more states that hold the constraint, such as for example prev_image(C), where C represents the constraint.

In some exemplary embodiments, the finite path shortening module 360 comprises a conjunction module 364. The conjunction module 364 may be configured to conjunct a first formula and a second formula. A formula may represent a set of states. The conjunction module 364 may be utilized to strengthen a constraint C by modifying the constraint C to C∧prev_image(C).

In some exemplary embodiments, the finite path shortening module 360 comprises a fixed point determination module 366. The fixed point determination module 366 may enable performing strengthening of a constraint iteratively. The fixed point determination module 366 may determine whether a fixed point is reached such that an additional strengthening of the constraint will not add any more states to be covered by the constraint.

In some exemplary embodiments, the model modifier 300 may comprise a finite path removal module 310. The finite path removal module 310 may be configured to detect a finite path in a model with respect to a constraint. The finite path removal module 310 may be configured to remove the finite path from the model by transforming the model to a modified model. The finite path removal module 310 may further modify the constraint such that it no longer will include a limitation that induces the finite path. The constraint may be modified in case the model inherently does not contain the state (or edge) which would represent an execution of a finite path.

In some exemplary embodiments, the finite path removal module 310 may comprise a model modification module 320 for modifying the model with respect to the constraint. The model modification module 320 may comprise a variable behavior extractor 324. The variable behavior extractor 324 may be configured to determine a behavior, also referred to as synthesize a behavior, of a variable based on a constraint.

In some exemplary embodiments, the variable behavior extractor 324 may determine whether a constraint induces a specific behavior for a variable, such as for example the constraint "X=TRUE" forces X to have the value TRUE. An exemplary algorithm that may be employed is as follows: iterate over all variables, ordered in a predetermined order, determine whether a value of a current variable may render the constraint invalidated. In case a FALSE value invalidates the constraint, the variable is determined to have a TRUE value, and vice versa. In case the value of the current variable does not render the constraint invalidated, its value may be nondeterministic, such as either TRUE or FALSE. It will be noted that a Binary representation may be extended to other domains by encapsulating more than a single bit per variable. The constraint may be modified to not refer to the variable any longer, by for example performing a mathematical operation of existing the variable out.

In some exemplary embodiments, a variable exist out module 326 may be utilized to perform an exist out or otherwise remove the variable from the constraint such that exists a value of the variable such that the constraint has a value of TRUE. An exist out operation of variable I may be performed using a disjunction operation between a C_T and C_F, where C_T is the constraint in case the variable I has a TRUE value and C_F is the constraint in case the variable I has a FALSE value.

In some exemplary embodiments, the variable behavior extractor 324 may use a predetermined order of the variables, such as ordering giving precedence to nondeterministic variables over state variables. The predetermined order may be configured to heuristically give precedence to one variable over another, such that it is more likely that the order renders important variables to have a deterministic value.

In some exemplary embodiments, the model modification module 320 further comprises a nondeterministic variable identifier 322. The nondeterministic variable identifier 322 may be configured to identify a nondeterministic variable, such as nondet_0, in a constraint. In some exemplary embodiments, the nondeterministic variable identifier 322 may be configured to define a new nondeterministic variable, such as the nondet_0, in the constraint. The disclosed subject matter may be utilized such that the variable behavior extractor 324 may extract a behavior of a nondeterministic variable, identified by the nondeterministic variable identifier 322.

In some exemplary embodiments, the finite path removal module 310 comprises a constraint modification module 330. The constraint modification module 330 may be configured to modify a constraint based on a model. The constraint modification module 330 may be configured to substitute a variable in a constraint with a formula representing a behavior of the variable in a model.

In some exemplary embodiments, the constraint modification module 330 may comprise a model injection module 350 for substituting a variable in a constraint with a formula associated with a behavior of the variable in a model. The model injection module 350 may determine the formula based on the assignment of the variable in the model. In some exemplary embodiments, the model injection module 350 may utilize a Binary Decision Diagram (BDD) that represents the variable in order to determine a formula.

In some exemplary embodiments, the constraint modification module 330 may comprise a variable chooser 340 for choosing a variable to substitute from the model. The variable chooser 340 may determine the variable based on user input, rules, command, preferences or the like. The variable chooser 340 may determine the variable based on a heuristic. An exemplary heuristic may be a heuristic which attempts replacing a variable with as many nondeterministic variables as possible.

In some exemplary embodiments, the variable chooser 340 may comprise a distance calculator 342. The distance calculator 342 may calculate a distance in a dependency graph between a variable and another variable. In some exemplary embodiments, the distance calculator 342 may calculate a minimum distance between a variable to a set of other variables, such as for example nondeterministic variables, denoted for example as nondet_i.

In some exemplary embodiments, the variable chooser 340 may comprise a random dependency counter 344 for counting a number of nondeterministic variables which a variable depends upon.

In some exemplary embodiments, the variable chooser 340 may comprise a support determinator 346 for determining a number of variables which are in a support set of a variable. A variable may be in a support set of another variable, if a value of the another variable is determined directly by the value of the variable.

In some exemplary embodiments, the variable chooser 340 may heuristically give precedence to variables with a small support set, a short distance to nondeterministic variables, a high random dependency count, a combination thereof or the like. The variable chooser 340 may give precedence to variables which are likely to introduce nondeterministic variables to the constraint without introducing too many state variables to the constraint.

In some exemplary embodiments, a model may provide the following definitions: "X:=Y disjunction Z"; "Y:=if W then TRUE else nondet_0"; "Z:=nondet_1"; and "W:=nondet_2". A constraint may be "X" requiring that the value of X will be true. The constraint modification module 330 may substitute X with its definition, such that the constraint may be "Y disjunction Z". The constraint modification module 330 may substitute Y with its definition such that the constraint may be "(if W then TRUE else nondet_0) disjunction Z". The model modification module 320 may be utilized to modify the nondeterministic variable nondet_0 such that in case Z and W are FALSE, nondet_0 is TRUE. The disclosed subject matter may reduce a measurement of nondeterminism of a nondeterministic variable such as for example the nondet_0 variable, another new non-deterministic variable or the like. The measurement of nondeterminism may be reduced such that some of the previously allowed nondeterministic behavior is no longer permitted.

In some exemplary embodiments, the model modifier may comprise a constraint removal module 380. The constraint removal module 380 may determine whether the constraint is always satisfied by the model, such as for example in case the constraint has been modified to TRUE. The constraint removal module 380 may determine that the constraint is not needed. For example, in case the constraint was modified to TRUE by modifying the model, the constraint no longer induces any limitation over the model and is therefore no longer required. Consider the modified model 200' of FIG. 2B, which does not comprise the finite path that were in the model 200 of FIG. 2A with respect to a constraint. In case the constraint does not induce any finite paths in the modified model 200', it may be ignored.

In some exemplary embodiments, the model modifier 300 comprises a resource limit module 370. The resource limit module 370 may be utilized to determine whether an iterative process, such as for example that which may be performed by the model modification module 320, the constraint modification module 330 or the finite path shortening module 360 may be halted as system resources were exhausted. The resources may be computing resources, memory allocation, time or the like. It will be noted that in some exemplary embodiments, utilizing the disclosed subject matter may be equivalent to performing a model checking operation which may be considered an NP-hard problem. Therefore, utilizing a resource limit module 370 may be useful to avoid state explosion problem or a long computation time. The resource limit module 370 may determine that the resources were exhausted based on the computational step, previous executions, memory size and allocation, time elapsed, user preferences, rules, commands, options or the like.

In some exemplary embodiments, the model modifier 300 may comprise a model checker 390, such as 140 of FIG. 1. The model checker 390 may be utilized to check a modified model that was determined by the model modifier 300 with respect to a modified constraint and a specification property such as 138 of FIG. 1.

Figure 4:
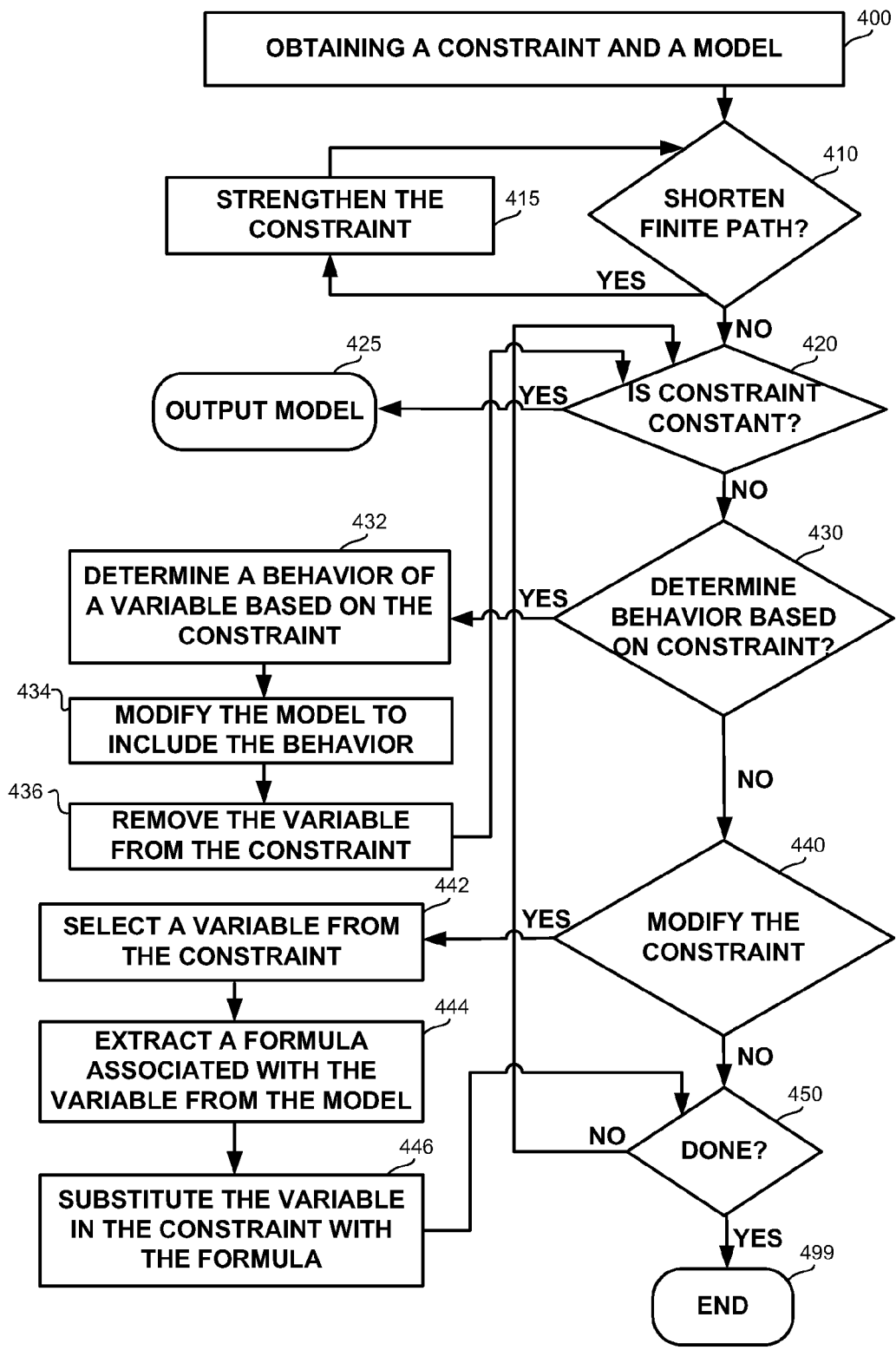
FIG. 4 shows a flowchart of a method, in accordance with some exemplary embodiments of the disclosed subject matter.

Referring now to FIG. 4 showing a flowchart of a method, in accordance with some exemplary embodiments of the disclosed subject matter.

In step 400 a constraint and a model may be obtained, such as for example by a first interface and a second interface. The model and constraint may be obtained by an I/O module such as 304 of FIG. 3.

In step 410, a determination whether to shorten a finite path is made. The determination may be made by a finite path shortening module, such as 360 of FIG. 3. The determination may be based on an input from a resource limit module, such as 370 of FIG. 3 or by a fixed point determination module, such as 366 of FIG. 3.

In case a determination is made to shorten the path, step 415 may be performed. In step 415 the constraint may be strengthened such as by conjunction with a previous image of the constraint with respect to the model. In some exemplary embodiments, other method to shorten one or more finite paths may be employed such as by manually modifying the constraint such that a predetermined path is shortened or a group of predetermined paths are shortened.

In step 420, the constraint is examined and checked whether it has a constant value.

In step 425, in case the constraint is constant an output may be provided to a user or a computerized device. In case the constant is FALSE the user may be notified that no state holds the constraint. In case the constant is TRUE the model may be outputted. The model may be utilized in model checking without a constraint.

In step 430, a determination is made whether to determine a behavior based on a constraint. The determination may be based on resource utilized, number of previous behaviors that were determined based on the constraint, a desire to modify the constraint in successive steps or the like.

In response to a positive determination, step 432 may be performed. A behavior of a variable may be determined based on the constraint. The variable may be a nondeterministic variable. The behavior may be determined by a variable behavior extractor such as 324 of FIG. 3.

In step 434 the model may be modified to include the behavior. The model may be modified by for example adding a definition such as a GDL definition to the model. The definition may be utilized to limit a nondeterministic measurement of the model.

In step 436, the variable may be removed from the constraint. The constraint may be existentially quantified over the variable. The variable may be removed using a variable exist out module, such as 326 of FIG. 3. In response to performing step 436, the flow passes back to step 420.

In step 440, which may be performed upon a negative determination in step 430, a determination whether to modify the constraint is made. The determination may be based on resource utilized, number of previous determinations to modify the constraint, a desire to modify the model in successive steps or the like.

In response to a positive determination, step 442 is performed. A variable may be selected from the constraint, such as for example by a variable chooser 340 of FIG. 3.

In step 444, a formula is extracted from the model. The formula may be associated with the variable. The formula may be determined by a constraint modification module such as 330 of FIG. 3. The formula may be determined based on a BDD associated with the variable.

In step 446, the variable in the constraint may be substituted by the formula. The substitution may be performed by a model injection module such as 350 of FIG. 3.

In step 450, a determination is made whether the method should stop or continue. The determination may be based upon resources used, a heuristic determination, previous executions, user input, preferences, commands, rules or the like.

In step 499, the method ends. In some exemplary embodiments, the method may further include utilizing the model with, or without the constraint, in a model checking stage against a specification property.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of program code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As will be appreciated by one skilled in the art, the disclosed subject matter may be embodied as a system, method or computer program product. Accordingly, the disclosed subject matter may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer-usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, and the like.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A computerized system comprising:
   a processor;
   a first interface configured to obtain a constraint;
   a second interface configured to obtain a first model, wherein the first model is configured to be utilized in model checking, and the first model, when constrained by the constraint, comprises at least one finite path; and
   a finite path removal module implemented in the processor and configured to generate a second model equivalent to the first model obtained by said second interface, wherein the second model excludes a portion of the at least one finite path, and the second model is configured to be utilized in model checking.

2. The computerized system of claim 1 further comprising a finite path shortening module configured to modify the constraint obtained by said first interface.

3. The computerized system of claim 2 wherein said finite path shortening module comprising:
   a previous image module, and
   a conjunction module, said conjunction module is configured to conjunct the constraint with an output of said previous image module.

4. The computerized system of claim 2 wherein said finite path shortening module further comprises a fixed point determination module.

5. The computerized system of claim 1, wherein said finite path removal module comprises a model modification module configured to modify the model obtained by said second interface, and said model modification module comprises a nondeterministic variable identifier.

6. The computerized system of claim 5, wherein said model modification module further comprising:
   a variable behavior extractor configured to extract a behavior associated with a variable based on the constraint; and
   a variable exist out module, wherein said variable exist out module is configured to remove the variable from the constraint.

7. The computerized system of claim 1, wherein said finite path removal module comprises a constraint modification module comprising a variable chooser.

8. The computerized system of claim 7, wherein said constraint modification module further comprises a model injection module for substituting a variable with a behavior based on a model.

9. The computerized system of claim 7, wherein said variable chooser comprises a module selected from the group consisting of a distance calculator and a random dependency counter.

10. The computerized system of claim 7 wherein said variable chooser comprises a support determinator.

11. The computerized system of claim 7, wherein said variable chooser comprises a distance calculator configured to determine a distance from a nondeterministic variable.

12. The computerized system of claim 1 further comprising a constraint removal module.

13. The computerized system of claim 1 further comprising a resource limit module.

14. The computerized system of claim 1 further comprising a model checker.

15. A method comprising:
   obtaining a constraint;
   obtaining a first model, wherein the first model is configured to be utilized in model checking, and the first model, when constrained by the constraint, comprises at least one finite path; and
   generating a second model equivalent to the first model by removing a portion of the at least one finite path from the first model, wherein said removing the portion of the at least one finite path is performed using a processor, wherein the second model is configured to be utilized in model checking.

16. The method of claim 15 further comprising shortening a portion of the at least one finite path.

17. The method of claim 16, wherein said shortening a portion of the at least one finite path comprises modifying the constraint to exclude a first state in the first model preceding a second state in the first model, wherein the second state resides on the portion of the at least one finite path.

18. The method of claim 17, wherein said shortening a portion of the at least one finite path is performed iteratively.

19. The method of claim 15, wherein said generating the second model comprises:
   synthesizing a behavior of a variable based on the constraint to have either a constant value or a nondeterministic value;
   modifying the second model to further comprise the behavior of the variable; and
   removing the variable from the constraint.

20. The method of claim 19, wherein said removing the variable from the constraint comprises existentially quantifying the constraint over the variable.

21. The method of claim 19, wherein said generating the second model further comprises selecting the variable, the variable is associated with the synthesized behavior based on the constraint, wherein the synthesized behavior is of a nondeterministic value.

22. The method of claim 15, wherein said removing a portion of the at least one finite path from the first model comprises modifying the constraint; wherein said modifying the constraint comprises:
   selecting a variable from the constraint; and
   substituting the selected variable in the constraint with a formula representing a behavior of the selected variable in the first model.

23. The method of claim 22, wherein said selecting a variable from the constraint comprises at least one step from the group consisting of:
   determining a distance of the variable from a nondeterministic variable;
   determining for the variable a number of nondeterministic variables that the variable depends on; and
   determining a support set associated with the variable.

24. A computer program product comprising:
   a non-transitory computer readable medium, having stored thereon executable program instructions, the program instructions comprising:
   first program instruction for obtaining a constraint;
   second program instruction for obtaining a first model, wherein the first model is configured to be utilized in model checking, and the first model, when constrained by the constraint, comprises at least one finite path; and
   third program instruction for generating a second model equivalent to the first model by removing a portion of the at least one finite path from the first model, wherein the second model is configured to be utilized in model checking.

* * * * *